(12) United States Patent
Alcott et al.

(10) Patent No.: US 7,807,984 B2
(45) Date of Patent: Oct. 5, 2010

(54) ION IMPLANTERS

(75) Inventors: Gregory Robert Alcott, West Sussex (GB); Adrian Murrell, West Sussex (GB); Matthew Castle, Morgan Hill, CA (US); Martin Hilkene, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 121 days.

(21) Appl. No.: 12/003,852

(22) Filed: Jan. 2, 2008

(65) Prior Publication Data
US 2009/0166565 A1 Jul. 2, 2009

(51) Int. Cl.
*H01J 37/304* (2006.01)
(52) U.S. Cl. .................. 250/492.21; 250/397
(58) Field of Classification Search ............ 250/492.21, 250/397, 398
See application file for complete search history.

(56) References Cited

U.S. PATENT DOCUMENTS

| | | | |
|---|---|---|---|
| 4,560,879 A | 12/1985 | Wu et al. | |
| 4,587,432 A | 5/1986 | Aitken | |
| 4,754,200 A | 6/1988 | Plumb et al. | |
| 4,980,562 A * | 12/1990 | Berrian et al. | 250/492.2 |
| 5,134,299 A | 7/1992 | Denholm | |
| 6,956,223 B2 * | 10/2005 | Smick et al. | 250/492.21 |
| 7,394,073 B2 * | 7/2008 | Cummings et al. | 250/397 |
| 2007/0102652 A1 | 5/2007 | Ring et al. | |
| 2008/0017811 A1 * | 1/2008 | Collart et al. | 250/492.21 |
| 2008/0164427 A1 * | 7/2008 | Collart et al. | 250/492.21 |

FOREIGN PATENT DOCUMENTS

| WO | 0237906 | 5/2002 |
|---|---|---|
| WO | 2007065896 | 6/2007 |

OTHER PUBLICATIONS

J. Opitz-Coutureau et al., "Biber—The Berlin Ion Beam Exposure and Research Facility" in *Proceedings of RADECS 2003: Radiation and Its Effects on Components and Systems*, Noordwijk, Netherlands, Sep. 15-19, 2003.

* cited by examiner

*Primary Examiner*—Kiet T Nguyen
(74) *Attorney, Agent, or Firm*—Boult Wade Tennant Dykema Gossett, PLLC (57) ABSTRACT

Components in an ion implanter that may see incidence of the ion beam include a chamber having an elongate slot opening defined by edges so that a central portion of the ion beam enters the component through the opening with the edges clipping at least a peripheral portion of the ion beam. The arrangement mitigates the problem of sputtered material escaping back out from the component and becoming entrained in the ion beam.

20 Claims, 6 Drawing Sheets

ION IMPLANTERS

FIELD OF THE INVENTION

The present invention relates to components in ion implanters having surfaces, such as graphite surfaces, adjacent to the path of the ion beam through the ion implanter. Such surfaces will be prone to sputtering, and sputtered material may become entrained in the ion beam. The present invention primarily addresses this problem of sputtering and entrainment of material.

BACKGROUND OF THE INVENTION

Ion implanters are used in the manufacture of semiconductor devices and other materials. In such ion implanters, semiconductor wafers or other substrates are modified by implanting atoms of a desired species into the body of the wafer, for example to form regions of varying conductivity.

Ion implanters are well known and generally conform to a common design as follows. An ion source generally comprises an arc chamber in which a hot plasma is generated. The plasma will contain ions of a desired species to be implanted.

An extraction lens assembly produces an electric field that extracts ions from the ion source and forms a mixed beam of ions. Only ions of a particular species are usually required for implantation in a wafer or other substrate, for example a particular dopant for implantation in a semiconductor wafer. The required ions are selected from the mixed ion beam that emerges from the ion source by using a mass analysing magnet in association with a mass resulting slit. By setting appropriate operational parameters on the mass analysing magnet and the ion optics associated therewith, an ion beam containing almost exclusively the required ion species emerges from the mass resolving slit. The ions travel along a flight tube as they pass through the mass analysing magnet.

The ion beam is transported along a beam line to a process chamber where the ion beam is incident on a substrate held in place in the ion beam path by a substrate holder. When a substrate is held clear of the ion beam path, the ion beam strikes a beamstop.

The various parts of the ion implanter are operated under the management of a controller, typically a suitably trained person, a programmed computer, or the like. A more detailed description of an ion implanter of this general type can be found in U.S. Pat. No. 4,754,200.

During normal operation of an ion implanter, unwanted material may become entrained in the ion beam. This material may strike the substrate causing contamination or even damage to the devices being formed on the substrate. A major source of contaminants is material from ion implanter components that surround the ion beam path. If the ion beam strikes such components, material may be sputtered from that surface. As the surfaces surrounding the ion beam path are typically made from graphite, graphite is a major component in the material entrained in the ion beam.

Entrained material may be conveyed directly to the substrate to be implanted, or it may adhere to another surface in the ion implanter. Surfaces adjacent to the ion beam are most prone to receiving such deposits. As the amount of material deposited accumulates, the chances of the deposits delaminating to form flakes or particles increases. These flakes or particles frequently detach from their host surface and may become entrained in the ion beam. Consequently, the flakes or particles contain sputtered material that still ultimately reaches the substrate.

Our co-pending U.S. patent application Ser. No. 11/651,107 and US Patent Application Publication No. 2007/0102652 address the problem of material depositing on downstream surfaces to form large flakes. The present invention is concerned with the initial sputtering of material and how to reduce the amount of material entrained in the ion beam. In particular, the present invention is concerned with sputtering of material from the flight tube.

A further problem is the liberation of material from the beamstop when it is struck by the ion beam. The close proximity of the substrate to the beamstop exacerbates the problem of contamination from the beamstop.

The present invention also finds application in so-called beam parks or flag Faradays, devices located part way along a beam line in an ion implanter to act as a beam dump.

SUMMARY OF THE INVENTION

Against this background, and from a first aspect, the present invention resides in an ion implanter comprising an ion source, a substrate holder arranged to hold a substrate in an implant position, an ion beam path extending from the ion source to the implant position, and a component positioned adjacent (laterally of) the ion beam path. The component comprises a chamber with an elongate slot opening defined by edges provided in a forward surface that faces the ion beam path such that the opening is positioned so as to receive ions from the ion beam. The component is arranged such that, in use, a central portion of the ion beam enters the component through the opening with the edges clipping at least a peripheral portion of the ion beam.

When the ion implanter is in use, the central part of the ion beam that contains the highest beam current may pass though the opening into the chamber. When these ions strike a surface within the chamber, the material that is sputtered from that surface is generally retained within the chamber and so does not become entrained in the ion beam. On the other hand, the relatively low-current peripheral part of the ion beam strikes the edges of the opening. Thus, the edges may define a narrow opening that opens into the chamber, thereby promoting retention of sputtered material. There is a balance to be struck: the further the edges penetrate inwardly, the better they are at retaining sputtered material, but the greater the portion of the ion beam they clip (and that could back-sputter material into the ion beam).

The edges may be defined by one or more walls having a forward face and a rearward face, the rearward face advantageously acting to absorb sputter material. The one or more walls may be set back from the front of the component.

Preferably, the component comprises a rear surface having line of sight to the ion beam path through the opening, and wherein the rear surface is oriented such that ions strike the surface substantially normally. Such an orientation minimises sputtering of material. Optionally, the distance from the opening to the rear surface is at least three times greater than the width of the opening, although depths of at least five times, at least ten times and at least twenty times the width are also contemplated.

Preferably, the slot is elongate and may have a large aspect ratio. For example, the slot may be at least three times, at least five times, at least ten times or at least twenty times as long as it is wide.

Ensuring that material does not escape back through the opening towards the ion beam may be assisted by shaping the back surface to include an angled face that extends generally along the length of the opening in the front face. This angled face will tend to see material sputtered at an angle away from the opening. The back surface may be provided with a pair of angled faces that meet at a ridge, thereby a substantially v-shaped projection into the chamber. This v-shaped projection may comprise the rear surface in its entirety, or may be formed on the rear surface, for example as a rib that extends from the rear surface.

The chamber may comprise further surfaces that join the front surface to the back surface, e.g. top and bottom surfaces. Any walls defining the opening may extend from these top and bottom surfaces. These surfaces may be provided with at least one ridge that extends generally in the direction of the length of the opening. Such a ridge may project into the component thereby forming a surface that assists in trapping sputtered material within the component. Optionally, these surfaces are provided with a series of ridges that extend generally in the direction of the length of the opening.

Many components in ion implanters are formed of graphite. The component may comprise a surface coating having a greater resistance to sputtering than graphite. Preferably, the coating is tungsten, tungsten carbide, tantalum carbide, titanium carbide or silicon carbide.

The components described above may comprise a further modification of one or more of its surfaces. One or more of the surfaces, including all of the faces, may have been roughened. Thus, an arrangement is achieved that resists deposition of material. This provides a two-pronged attack: the initial deposition of material into large flakes is resisted, and entrainment of any sputtered material into the ion beam is also resisted.

The faces may be roughened so as to provide a pattern of surface features, such as a regular pattern of surface features. Optionally, the faces may have been roughened to provide surface features defined at least in part by sharp changes in orientation of adjacent parts of the face, for example to provide surface features defined at least in part by adjacent faces that meet at a sharp edge.

The surface may have been roughened to provide a series of grooves. The grooves may have a depth in a range of 0.1 mm to 10 mm, 0.25 mm to 7.5 mm, or 0.5 mm to 5 mm. The faces may have been roughened to provide a series of side-by-side grooves, for example to have a regular spacing in a range of: 0.1 mm to 10 mm, 0.25 mm to 7.5 mm, or 0.5 mm to 5 mm. Consequently, the grooves on each individual face are on a smaller scale than the scale of the faces themselves. The grooves may have any of the following cross-sectional profiles: v-shape, u-shaped, saw tooth or box-like trenches.

Preferably, the faces have been roughened to provide at least two intersecting series of grooves. The first series and second series may be disposed orthogonally. The first and second series may comprise v-shaped grooves that intersect to form an array of tetrahedra.

Optionally, the component is a beamstop. For example, the component may be positioned downstream of the implant position so as to receive the ion beam when the substrate and substrate holder are clear of the ion beam as it passes through the implant position.

Alternatively, the component may be positioned within a flight tube of a mass analyser. In this way, the component may be used to receive ions with mass-to-charge ratios outside those chosen for mass selection. The component may also be positioned in a "straight through" position so as to receive the ion beam if the magnet of the mass analyser is switched off. In this way, the component may act as a beam dump. Such a flight tube may be provided with multiple such components.

A further alternative is to provide the component in association with a scanner magnet or a collimator magnet so as to receive stray ions and also to receive the ion beam when in extreme positions, i.e. when the beam would otherwise clip an aperture.

In any application, the provision of a chamber behind the forward face means that material sputtered from the ions striking a rear face of the chamber is retained within the chamber. Thus, the material does not become entrained within the ion beam and cannot contaminate the substrate.

BRIEF DESCRIPTION OF THE DRAWINGS

In order that the present invention may be better understood, a preferred embodiment will now be described with reference to the accompanying drawings, in which.

DETAILED DESCRIPTION OF THE INVENTION

Figure 1:
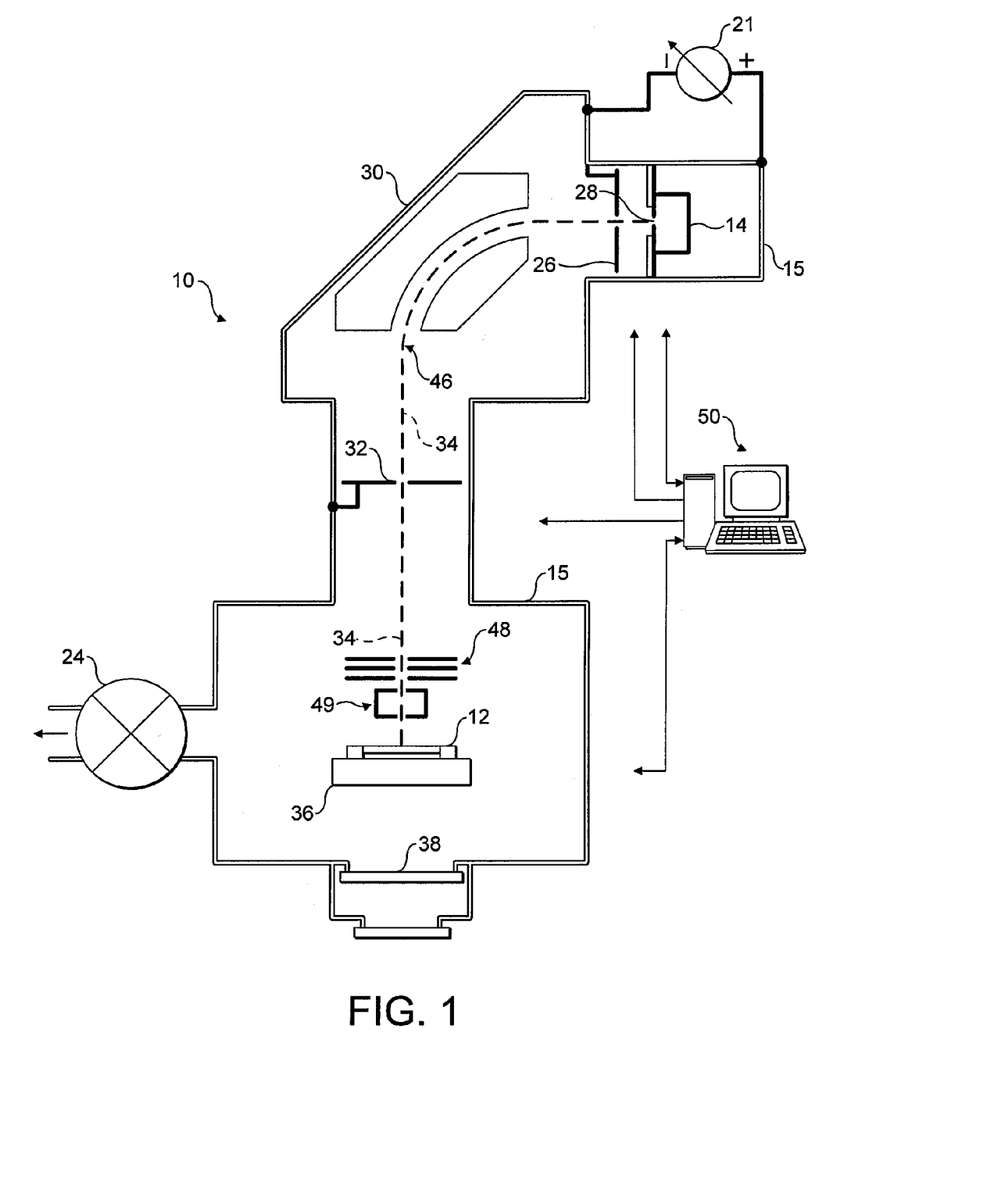
FIG. 1 is a schematic representation of an ion implanter.

In order to provide a context for the present invention, an exemplary application is shown in FIG. 1, although it will be appreciated this is merely an example of the application of the present invention and is in no way limiting.

FIG. 1 shows an ion implanter 10 for implanting ions in semiconductor wafers 12 (or other substrates) that may be used in accordance with the present invention. The ion implanter 10 comprises a vacuum chamber 15 pumped through valve 24. Ions are generated by ion source 14 and are extracted by an extraction lens assembly 26 to form an ion beam 34. In this embodiment the ion beam 34 is steered and shaped through the ion implanter 10 such that the ion beam 34 passes through a mass analysis stage 30. Ions of a desired mass are selected to pass through a mass resolving slit 32 and then conveyed onward along an ion beam path 34 towards the semiconductor wafer 12. In this embodiment, the ions are decelerated before reaching the semiconductor wafer 12 by deceleration lens assembly 48. The ions then pass through a plasma flood system 49 that acts to neutralise the ion beam 34.

Ions formed within the ion source 14 are extracted through an exit aperture 28 using a negatively-biased (relative to ground) extraction electrode 26. A potential difference is created between the ion source 14 and the following mass analysis stage 30 by a power supply 21 such that the extracted ions are accelerated. The ion source 14 and mass analysis stage 30 are electrically isolated from each other by an insulator (not shown).

The mixture of extracted ions are then passed through the mass analysis stage 30 so that the mixture passes around a curved path through a flight tube 46 under the influence of a magnetic field. The radius of curvature travelled by any ion is determined by its mass, charge state and energy. The magnetic field is controlled so that, for a set beam energy, only those ions with a desired mass-to-charge ratio energy exit along a path coincident with the mass resolving slit 32.

The ion beam 34 is then transported to the target, i.e. the substrate wafer 12 to be implanted or a beamstop 38 when there is no wafer 12 in the target position. Before arriving at the wafer 12 or beamstop 38, the ions may be decelerated using a deceleration lens assembly like that shown at 48 positioned between the mass analysis stage 30 and upstream of the wafer 12. The deceleration lens assembly 48 is followed by a plasma flood system 49 that operates to produce a flood of electrons that are available to the semiconductor wafer 12 to neutralise the effect of the incident positive ions.

The semiconductor wafer 12 is mounted on a wafer holder 36, wafers 12 being successively transferred to and from the wafer holder 36 for serial implantation. As an alternative, parallel processing may be used where many wafers 12 are positioned on a carousel 36 that rotates to present the wafers 12 to the incident ion beam 34 in turn.

At times when the wafer(s) 12 is clear of the ion beam path, the ion beam 34 strikes a beamstop 38 where it is adsorbed. This beam strike may liberate material and electrons from the beamstop 38.

A controller is shown at 50 that comprises a suitably programmed computer. The controller 50 is provided with software for managing operation of the ion implanter 10.

Figure 2:
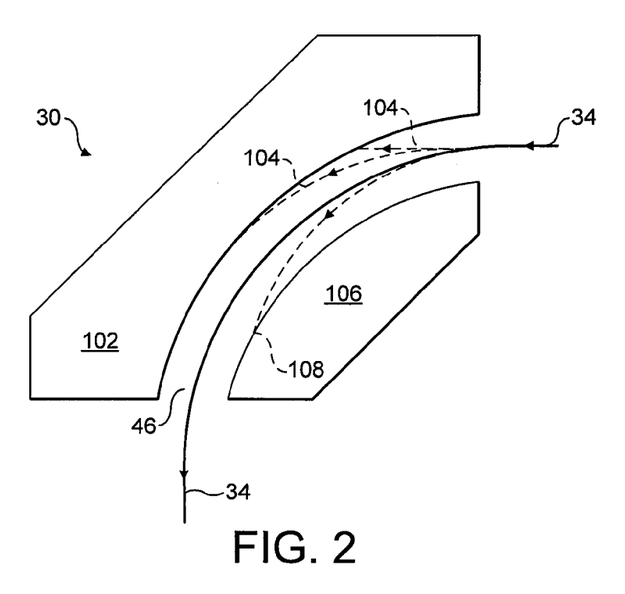
FIG. 2 is a schematic representation of a flight tube of the ion implanter of FIG. 1.

FIG. 2 shows a representation of the mass analyser 30 of FIG. 1, along with the path 34 of ions through a flight tube 46 defined by the mass analyser 30. The solid line 34 shows the path of ions having the desired mass-to-charge ratio and describes a smooth quarter-turn through the mass analyser 30. Ions having a greater mass-to-charge ratio may strike an outer part 102 of the mass analyser 30, as shown at 104. Conversely, ions having a lesser mass-to-charge ratio will turn inwardly and may strike an inner part 106 of the mass analyser 30, as shown at 108.

Ions that strike the mass analyser 30 in these ways may sputter material from those parts 102, 106. Typically, these parts 102, 106 will be made from graphite and so there is a danger that graphite will become entrained in the ion beam as it passes through the mass analyser 30. This entrained material may be deposited on nearby parts, causing deposited coatings that can then flake off, generating particulates. These particulates can then be transported to the wafer 12, causing contamination.

Figure 3:
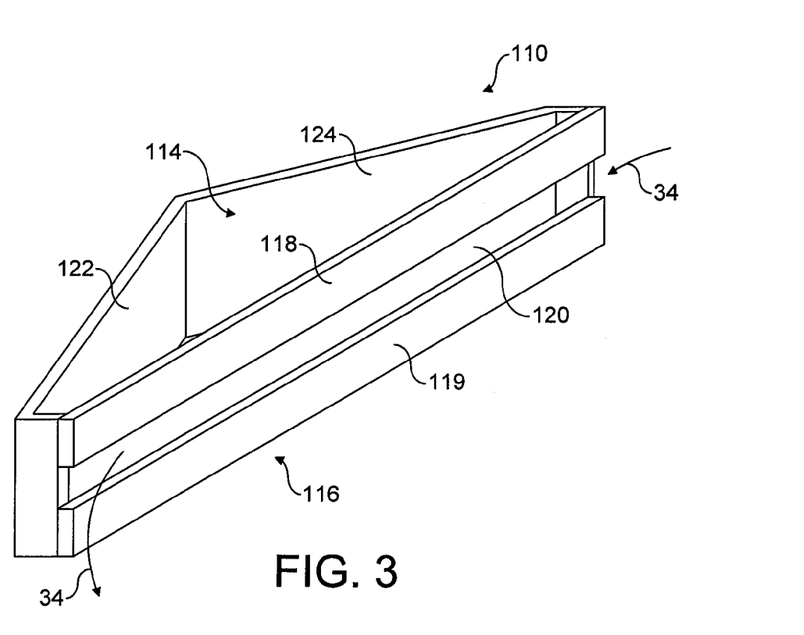
FIG. 3 is a simplified schematic of a component according to the present invention that may be used in the flight tube of FIG. 2.

FIG. 3 shows a simplified representation of a component 110 of the flight tube 46. The component 110 is used in the flight tube in portions that may receive some or all of the ion beam 34. For example, one or more of the components 110 may be used to form the outer part 102 or inner part 106 shown in FIG. 2.

The component 110 comprises a chamber 114 formed behind a front face 116 of the outer part 102. The front face comprises walls 118 and 119 separated by a central slot 120. The chamber 114 comprises a pair of rear surfaces 122 and 124 set at an angle to one another. Although omitted for the sake of clarity, a top surface and a bottom surface extend between the rear surfaces 122-124 to meet the walls 118-119 and so enclose chamber 114.

Ion beam 34 passes through the flight tube 46 as indicated schematically in FIG. 2. The slot 120 extends generally in the direction of the ion beam path 34, although the component 110 is angled to present the rear surface 122 to be normal to the ion beam 34. Slot 120 is much wider than the ion beam 34 is tall. Thus, slot 120 has a large aspect ratio, for example as low as 3:1 or as high as 20:1.

Ion beam 34 passes through the flight tube 46 as indicated schematically in FIG. 3. The slot 120 extends generally in the direction of the ion beam path 34, although the component 110 is angled to present the rear surface 122 to be normal to the ion beam 34. Slot 120 is much wider than the ion beam 34 is tall. Thus, slot 120 has a large aspect ratio, for example as low as 3:1 or as high as 20:1.

Accordingly, any heavier ions like those shown at 104 in FIG. 2 will pass through the slot 120 and will then strike one of the rear surfaces 122-124. Material sputtered from the rear surfaces 122-124 as a result of such beam strike is prevented from becoming entrained in the ion beam 34 by the walls 118 and 119. Instead, sputtered material will collect on the surfaces that surround the chamber 114.

Walls 118 and 119 have a depth such that ions formerly from the central part of the ion beam 34 pass through the slot 120, whereas ions formerly from the top and bottom parts of the ion beam 34 strike the walls 118 and 119. Relatively few ions are expected to strike the walls 118 and 119 due to the low current of the edges of the ion beam. However, the deepened walls 118 and 119 will offer improved retention of material sputtered from the rear surfaces 122-124.

The energy released as ions strike the flight tube 46 causes the flight tube 46 to warm. As sputtering increases with temperature, cooling may be provided to the flight tube 46 and to the rear surfaces 122-124 in particular. Any suitable form of cooling may be used, such as water cooling through, for example, channels formed in the walls behind the rear surfaces 122-124.

Figure 4:
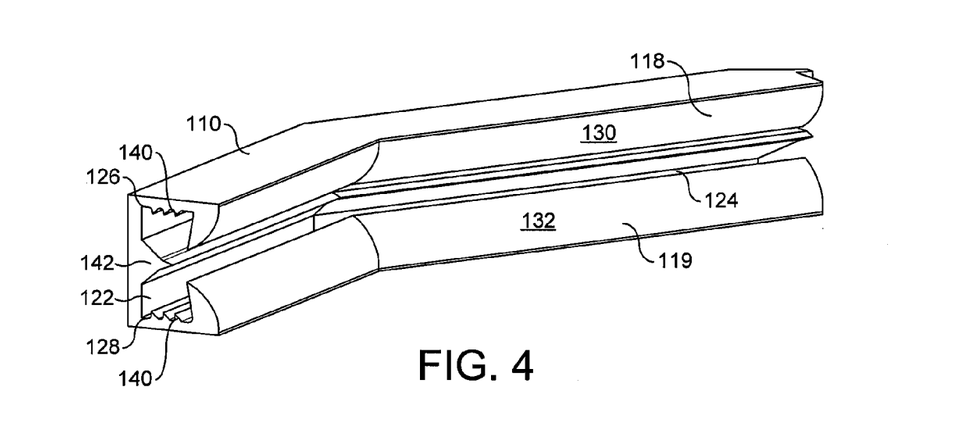
FIG. 4 is a perspective view of a component according to a first embodiment of the present invention that may be used in the flight tube of FIG. 2.

FIG. 4 shows a perspective view of a component 110. In common with the component 110 of FIG. 3, this component 110 comprises back surfaces 122-124, walls 118-119 defining slot 120 therebetween, top surface 126, and bottom surface 128 to define chamber 114. In this embodiment, the walls 118-119 are angled to correspond to the back surfaces 122-124. In addition, the walls 118-119 are re-entrant to point into chamber 114 and have curved front faces 130-132 to define a taper to sharp ridges 134-136 that define the slot 120.

Top and bottom surfaces 126-128 are each provided with a series of three ridges 138-140 that extend along the length of the chamber 114. The ridges 138-140 present an upright face that faces towards the rear surfaces 122-124 and an angle face that faces generally towards the adjacent wall 118-119.

The rear surfaces 122-124 are provided with a central rib 142 that extends along the length of the chamber 114. The top of the rib 142 comprises a sharp ridge defined by two sides that meet at an acute angle, e.g. 40°. The rib 142 also comprises a shallower base defined by sides set at an oblique angle to one another, e.g. 70°.

Figure 5:
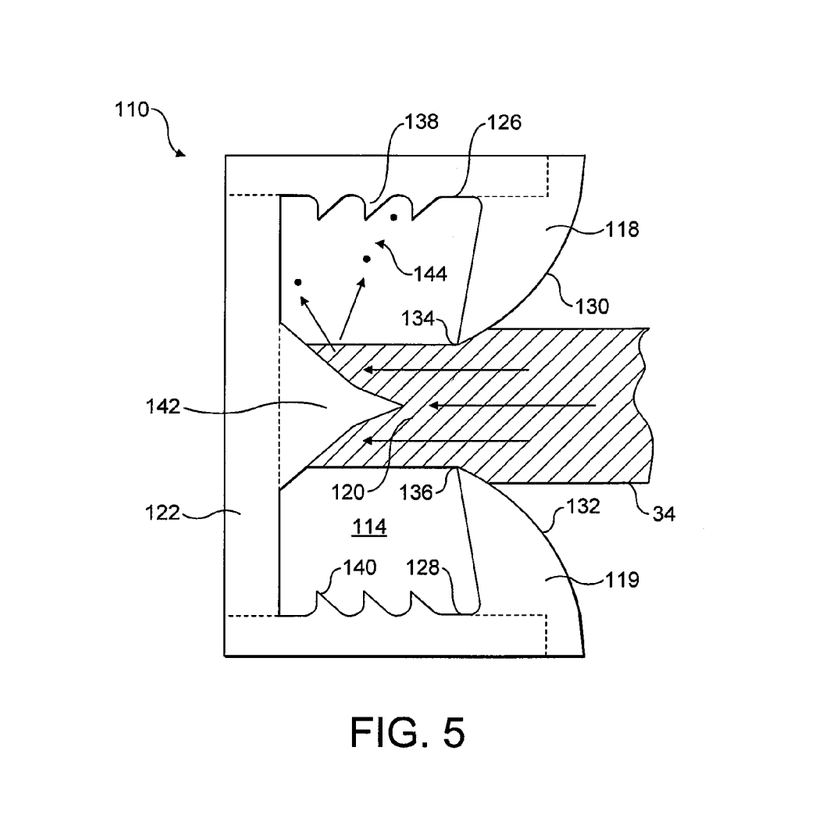
FIG. 5 is a side sectional view of the component of FIG. 4.

FIG. 5 shows how the component 110 is configured to trap material sputtered as a result of beam strike. A central portion of the ion beam 34 is seen to enter the chamber 114 through slot 120 and strike the rib 142. The angled faces of rib 142 end material sputtered into the chamber 114, as shown at 144. This material is trapped by the walls 118-119 or by the ridges 138-140 on the top and bottom surfaces 126-128.

Figure 6:
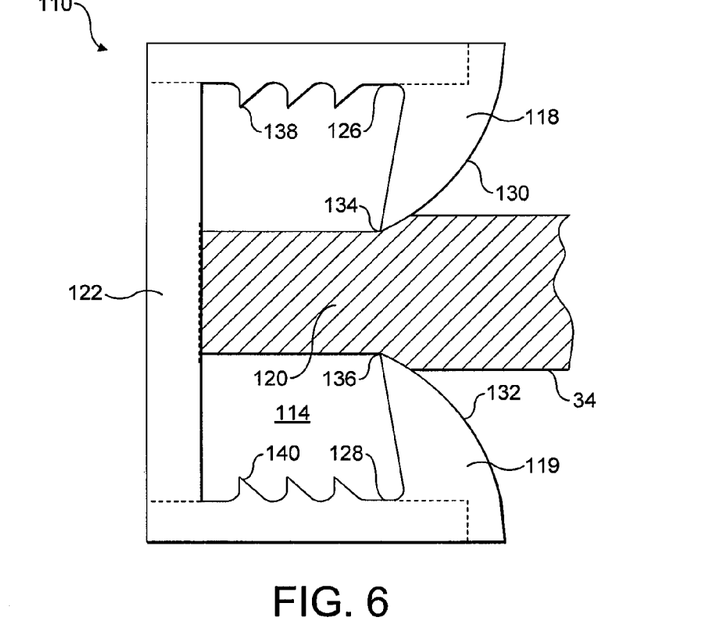
FIG. 6 is a side sectional view of a component like that of FIG. 4, but modified in accordance with a second embodiment of the present invention.

The rib 142 may be omitted to arrive at the component 110 shown in FIG. 6. Although slightly inferior to the component 110 of FIG. 5, it will still perform satisfactorily.

Figure 7:
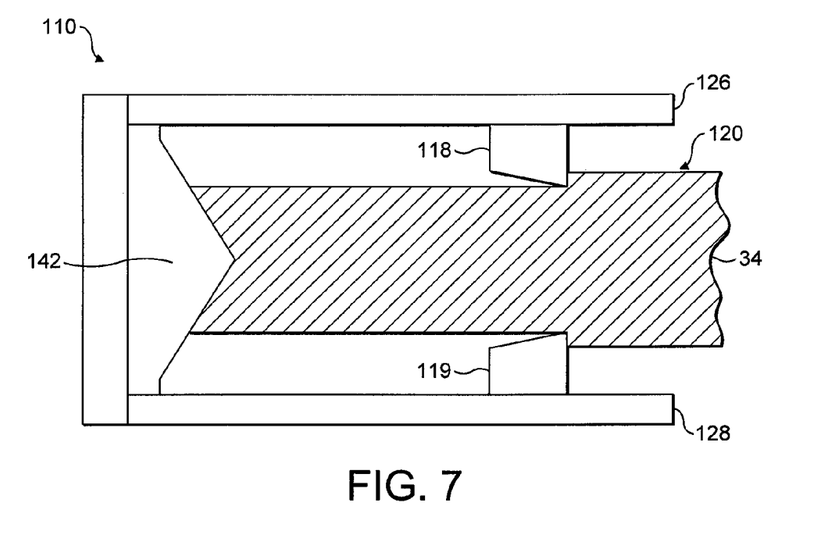
FIG. 7 is a side sectional view of a component like that of FIGS. 4 and 6, but modified in accordance with a third embodiment of the present invention.
Figure 8:
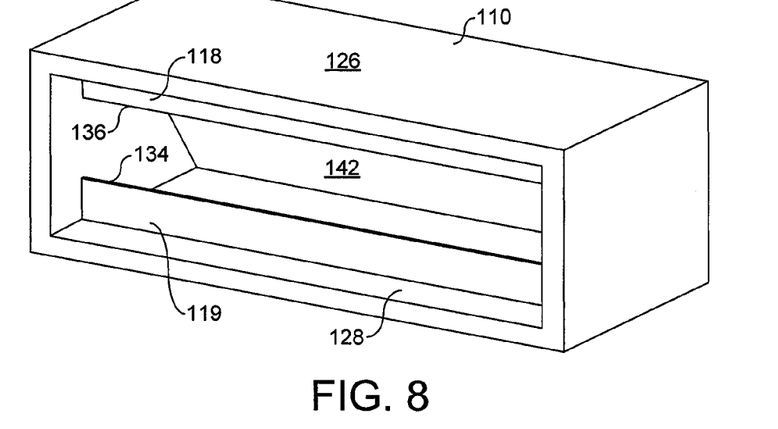
FIG. 8 is a perspective view of the component of FIG. 7.

Another simplified arrangement is shown in FIGS. 7 and 8. Here, component 110 is generally box-like with only a single rear surface 122. The component 110 is provided with a rib 142 that fixes to rear surface 122 to occupy all of the rear surface 122 between top and bottom surfaces 126-128. Walls 118-119 are provided to project from the top and bottom surfaces 126-128, but are set slightly back from the front edge of these surfaces 126-128. In addition, the walls 118-119 have a tapering form such that their inner surfaces 134-136 diverge to provide an aperture 120 that widens as it passes through the walls 118-119.

Figure 9:
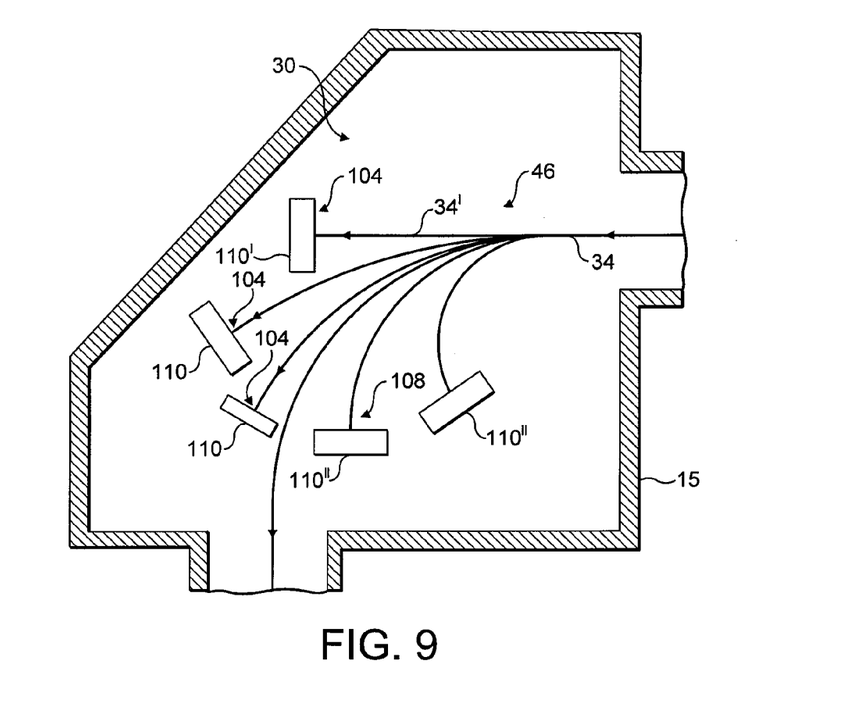
FIG. 9 is a schematic representation of a flight tube of the ion implanter of FIG. 1 including multiple components like that shown in FIGS. 7 and 8.

FIG. 9 shows how a series of outer parts 110 may be positioned within a flight tube 46 so as to receive ions from the ion beam 34. Three components 110 are placed to receive ions with a relatively large mass-to-charge ratio, as indicated at 104. One of the components 110' may act as a beam dump to receive the ion beam 34 when the magnet is switched off such that the ions follow the straight path shown at 34'. Two further components 110" are positioned to receive ions with relatively low mass-to-charge ratios as indicated at 108. As will be apparent from FIG. 9, each of the components 110 is angled to ensure the rear surface 122 faces the incoming ions (or at least does so for ions striking the centre of the component 110, with minimal angles away from the normal for ions striking away from the centre).

FIG. 9 shows the present invention as it may be applied to the inner part 106 of the flight tube 46. It will be understood that any of the features described in the embodiments above and below may be used in conjunction with the inner part 106 of the flight tube 46.

The above components 110 tackle the problem of sputtered material becoming entrained in the ion beam 34 by trapping sputtered material. Another approach to reduce the problem of contamination is to reduce the amount of sputtered material that is generated in the first place. To this end, components 110 may be formed of graphite and treated so as to provide a coating of another material. Ideal candidates are tungsten, tungsten carbide, tantalum carbide, titanium carbide and silicon carbide. Providing such components 110 with a thin coating of one such material has been found to reduce particle and flake formation and has also been seen to extend the life of the graphite part. The tungsten, tungsten carbide, tantalum carbide, titanium carbide or silicon carbide coating can be applied to the graphite part using chemical vapour deposition, sputtering or plasma spraying. Other methods of coating will be apparent to the person skilled in the art.

The above embodiments, are described in the context of a flight tube 46 in a mass analyser 30. However, the idea of a chamber 114 adjacent the ion beam 34 to trap particles may be employed on other components within the ion implanter 10.

Figure 10:
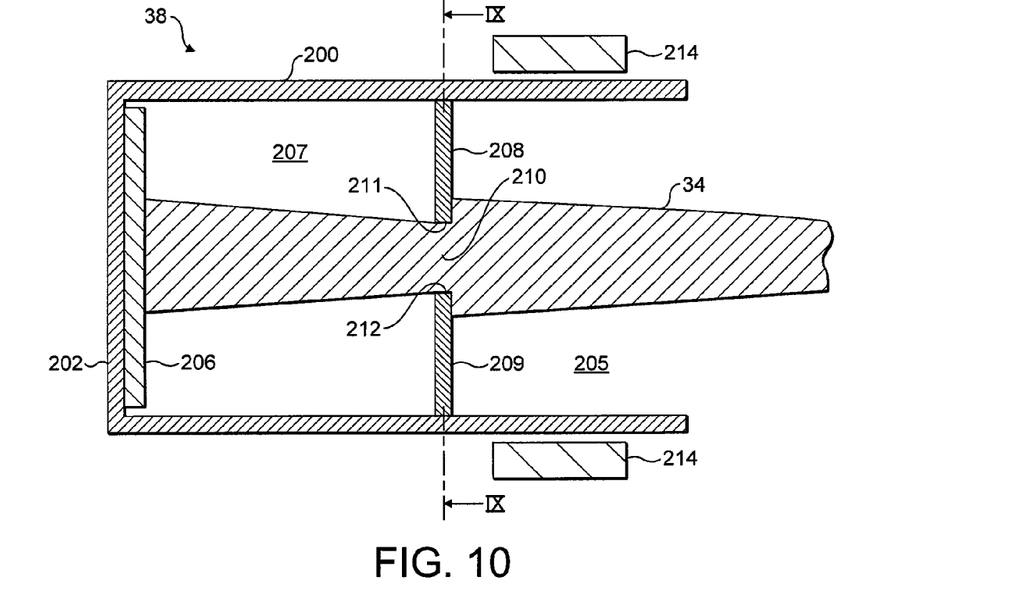
FIG. 10 is a side sectional view of a beamstop in accordance with an embodiment of the present invention.
Figure 11:
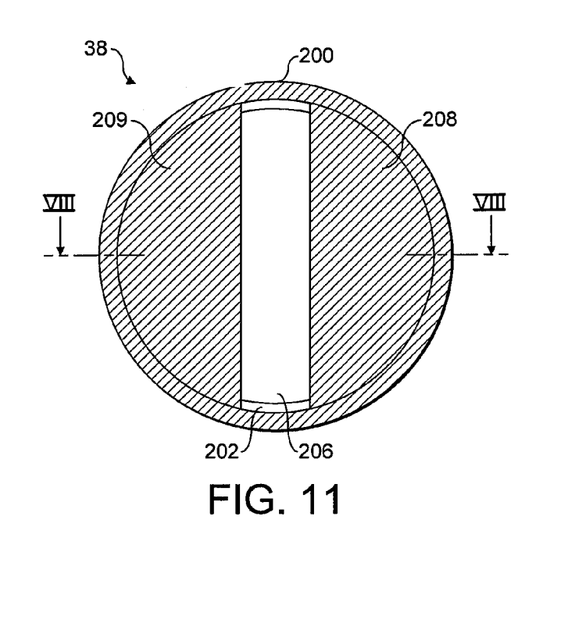
FIG. 11 is an end sectional view of the beamstop of FIG. 10.

For example, the present invention may be applied to the beamstop 38, and such an embodiment is shown in FIGS. 10 and 11. The beamstop 38 comprises a cylindrical side wall 200, a circular end wall 202 and an open front face 204 that together define a bore 205. A beam-collecting surface 206 is provided on the end wall 202. Set halfway along the bore 205 is a pair of walls 208 and 209 that define a narrow slot 210 therebetween. A chamber 207 is defined behind the walls 208-209 and by the end wall 202 and side wall 200. A magnet 214 provides a magnetic field that suppresses the emission of electrons from the beamstop 38. An electric field may be used for this purpose instead.

Walls 208 and 209 extend from opposite sides of the side wall 200 and terminate at a pair of parallel straight edges 211 and 212. The narrow slot 210 that they define is ideally suited for use with a ribbon beam 34 that extends in the same direction as slot 210. As such, the slot 210 should have a high aspect ratio. The open face 204 is large enough to allow all the ribbon beam 34 to enter into the bore 205 without any striking the end of the side wall 200. The slot 210 is considerably smaller such that it allows most but not all the ribbon beam 34 to pass through. For example, the slot may typically allow 75% of the ribbon beam 34 to pass. The remaining 25% will clip the walls 208-209. Any electrons ejected as a result cannot travel back out from the beamstop 38 by virtue of the suppression magnetic field described above.

The bulk of the ribbon beam 34 passes through to the chamber 207 where it strikes the beam-collecting surface 206. Although the beam-collecting surface 206 is designed to reduce contamination, the beam 34 striking the beam-collecting surface 206 may sputter material from that surface 206 along as liberating electrons. The walls 208-209 act as baffles to stop the sputtered material escaping from the beamstop 38 and possibly contaminating the adjacent wafer 12. The beam current may be measured by monitoring the charge accumulating on the rear surface 202 and walls 208-209 with any convenient means.

As will be appreciated by the person skilled in the art, variations may be made to the above embodiment without departing from the scope of the invention defined by the claims.

The flight tubes 46 of FIGS. 3 and 4 are shown to have rear surfaces 122-124 that meet at an angle and, in the case of FIG. 4, walls 118-119 that also meet at an angle. However, this need not be the case. For example, a single linear rear surface 122-124 may be used or a curved rear surface 122-125 may be used. The same treatment may be applied to the walls 118-119.

The present invention may be used with magnets other than that present in the flight tube 46. For example, a component 110 like those shown above may be used in conjunction with an aperture associated with a scanner magnet or collimator magnet. Thus any beam strike on the edges of the aperture may be mitigated by providing components 110 to define the aperture.

Where the present invention is applied to downstream components, there is a greater likelihood of deposition of sputtered material ablated from components upstream in the ion implanter 10. As mentioned previously, our co-pending patent application U.S. Ser. No. 11/651,107 describes a way of mitigating against flake delamination of such deposited material (and the entire contents of U.S. Ser. No. 11/651,107 are incorporated herein by reference). In this application, surfaces are patterned with grooves to prevent flake formation. This technique may be used in conjunction with the present invention in that surfaces may be patterned in any of the ways described therein, rather than just being the plain surfaces shown in the figures. For example, the front faces 130-132 of the walls 118-119 may be provided with a series of tetrahedra formed by patterning the faces 130-132 with two series of grooves that intersect at right angles. The tetrahedra assist in preventing delamination of larger flakes of material.

The invention claimed is:

1. An ion implanter comprising an ion source, a substrate holder arranged to hold a substrate in an implant position, an ion beam path extending from the ion source to the implant position, and a component positioned laterally of the ion beam path, wherein the component comprises a chamber with an elongate slot opening defined by edges provided in a forward surface that faces the ion beam path such that the opening is positioned so as to receive ions from the ion beam, and wherein a central portion of the ion beam enters the component through the opening with the edges clipping at least a peripheral portion of the ion beam.

2. The ion implanter of claim 1, wherein the elongate slot opening has a large aspect ratio.

3. The ion implanter of claim 2, wherein the opening is at least three times as long as it is wide.

4. The ion implanter of claim 1, wherein the edges are defined by one or more walls having a forward face and a rearward face.

5. The ion implanter of claim 4, wherein the one or more walls are set back from the front of the component.

6. The ion implanter of claim 1, wherein the component comprises a rear surface having line of sight to the ion beam path through the opening, and wherein the rear surface is oriented such that ions strike the surface substantially normally.

7. The ion implanter of claim 6, wherein the distance from the opening to the rear surface is at least three times greater than the width of the opening.

8. The ion implanter of claim 6, wherein the rear surface is shaped to include an angled face that extends generally along the length of the opening.

9. The ion implanter of claim 8, wherein the rear surface is shaped to include a second angled face that meets the first angled face at a sharp intersection, the two angled faces forming a substantially v-shaped projection into the chamber.

10. The ion implanter of claim 8, wherein at least one angled face is arranged so as not to face the opening.

11. The ion implanter of claim 6, wherein the component comprises further surfaces that join the forward surface to the rear surface, and wherein the further surfaces are provided with at least one ridge that extends generally in the direction of the length of the opening.

12. The ion implanter of claim 11, wherein the further surfaces are provided with a series of ridges that extend generally in the direction of the length of the opening.

13. The ion implanter of claim 1, wherein the component is formed of graphite and comprises a surface coating having a greater resistance to sputtering than graphite.

14. The ion implanter of claim 13, wherein the coating is tungsten, tungsten carbide, tantalum carbide, titanium carbide or silicon carbide.

15. The ion implanter of claim 1, comprising a surface that has been roughened to provide a pattern of surface features.

16. The ion implanter of claim 15, wherein the surface features comprises an array of tetrahedra.

17. The ion implanter of claim 1, wherein the component is a part of a flight tube of a mass analyser.

18. The ion implanter of claim 17, wherein the flight tube comprises multiple such components.

19. A method of operating an ion implanter comprising a component positioned laterally of an ion beam path through the ion implanter, wherein the component comprises a chamber with an elongate slot opening defined by edges provided in a forward surface that faces the ion beam path such that the opening is positioned so as to receive ions from an ion beam, the method comprising the steps of:
generating an ion beam;
receiving a central portion of the ion beam through the opening in the component; and
clipping at least a peripheral portion of the ion beam with the edges.

20. The method of claim 19, further comprising receiving at least a part of the central portion of the ion beam on a rear surface of the component, wherein the ion beam strikes the surface substantially normally.

* * * * *